United States Patent [19]
Sarashina et al.

[11] Patent Number: 5,948,466
[45] Date of Patent: Sep. 7, 1999

[54] METHOD FOR FORMING FIDUCIAL MARK IN RESIN STENCIL AND STENCIL FORMED THEREBY

[75] Inventors: Eigo Sarashina, Kofu; Yousuke Nagasawa, Nakakoma-gun; Ken Takahashi, Nakakoma-gun; Takao Naito, Nakakoma-gun, all of Japan

[73] Assignee: Matsushita Electric Industrial Co., Ltd., Kadoma, Japan

[21] Appl. No.: 08/981,412
[22] PCT Filed: Apr. 16, 1997
[86] PCT No.: PCT/JP97/01310
  § 371 Date: Dec. 16, 1997
  § 102(e) Date: Dec. 16, 1997
[87] PCT Pub. No.: WO97/39609
  PCT Pub. Date: Oct. 23, 1997

[30] Foreign Application Priority Data

Apr. 18, 1996 [JP] Japan ................................ 8-97082

[51] Int. Cl.⁶ ........................................ B05D 5/12
[52] U.S. Cl. ................ 427/97; 427/98; 427/555; 101/127; 101/128.21; 101/128.4; 118/504; 33/666; 257/797; 438/945; 438/975
[58] Field of Search ................. 427/96, 97, 98, 427/554, 555, 282; 101/127, 128.21, 128.4; 118/504; 33/666; 257/797; 438/945, 975

[56] References Cited

U.S. PATENT DOCUMENTS 5,669,970 9/1997 Balog et al. ............................ 118/213
5,727,461 3/1998 Clayfield et al. ....................... 101/127
5,740,730 4/1998 Thompson, Sr. ....................... 101/127

FOREIGN PATENT DOCUMENTS 359 862   3/1990   European Pat. Off. .
63-216983 9/1988   Japan .
5-77577   3/1993   Japan .
6-250395  9/1994   Japan .
7-156569  6/1995   Japan .

*Primary Examiner*—Brian K. Talbot
*Attorney, Agent, or Firm*—Wenderoth, Lind & Ponack, L.L.P.

[57] ABSTRACT

An engraved recess (4) is formed in a resin stencil (1) at a position on a surface of the resin stencil where the resin stencil, when registered with a circuit board, agrees with a fiducial mark of the circuit board. The recess is formed by a laser (3) and serves as a fiducial mark.

12 Claims, 3 Drawing Sheets

METHOD FOR FORMING FIDUCIAL MARK IN RESIN STENCIL AND STENCIL FORMED THEREBY

This application is a 371 of PCT/JP97/01310 filed Apr. 16, 1997, now WO97/39609.

TECHNICAL FIELD

The present invention relates to a method for forming a fiducial mark in a resin stencil used in printing of a solder paste onto a wiring pattern of a circuit board, and a stencil formed by the method.

BACKGROUND ART

A metal mask has been employed as a screen in printing of a solder paste onto a wiring pattern of a circuit board. As the circuit board has increased in size and mounting density, the metal mask has been required to be large with a precise opening pattern. Recently, the metal mask used is 600 mm long, 600 mm wide or larger, with a thickness of 0.1–0.15 mm and, the opening pattern is processed precisely with the use of a laser or the like.

In order to form a fiducial mark in the metal mask, a through hole is opened at a position of the fiducial mark simultaneously when the opening pattern is processed. Then the through hole is filled with a resin or an aluminum adhesive tape is attached to the through hole from the rear side to prevent solder paste from entering and adhering to the circuit board. The through hole is opened at the position of the fiducial mark in this case, because the laser technique affords only to form the through hole in the metal mask.

As such, processing accuracy for the opening pattern is required to be enhanced furthermore so as to improve the mounting density of the circuit board. However, the laser technique or any other methods cannot eliminate the issue of a peripheral part of the processed opening pattern being tapered in the case of the metal mask, that is, there is a limitation with respect to the improvements of the processing accuracy. At the same time, even when the metal mask is thinned to 0.1–0.15 mm, the metal mask of stainless steel or the like is hard and will not fit well to the circuit board, which can adversely influence the printing accuracy.

For solving the above-described issues, a resin stencil has been used. The resin stencil can be similarly made 600 mm wide, 600 mm long or larger and 0.1–0.15 mm thick. The peripheral part of the opening pattern can be processed perpendicularly by an excimer laser, without generating tapers, and therefore the processing accuracy is improved. Moreover, because of the resin, the stencil is soft as compared with a metal mask of stainless steel or the like and thus it can be conveniently fit to the circuit board.

When a fiducial mark is to be formed in the conventional resin stencil, a through hole is formed at a position of the fiducial mark simultaneously when the opening pattern is processed in the resin stencil, in the same manner as in the metal mask. Subsequently the through hole is filled with a resin 11 as shown in FIG. 7 or an aluminum adhesive tape 12 is attached to a rear face of the resin stencil as shown in FIG. 8 to prevent the solder paste from penetrating the through hole and adhering to the circuit board.

In other words, one additional step of filling the through hole with the resin 11 is necessary according to the prior art method, which is troublesome and results in higher costs.

Meanwhile, although attaching the aluminum adhesive tape 12 from the rear side is inexpensive, a gap due to the thickness of the aluminum adhesive tape 12 is formed between the resin stencil 10 and the circuit board. This adversely influences the printing accuracy and is consequently not recommended.

SUMMARY OF INVENTION

The present invention has for its object to provide a method for forming a fiducial mark in a resin stencil without adversely influencing printing accuracy, and a stencil formed by the method.

In accomplishing these and other objects, according to a first aspect of the present invention, there is provided a method for forming a fiducial mark in a resin stencil used in printing of solder paste onto a wiring pattern of a circuit board, The method includes processing an engraved recess, which does not penterate the resin stencil, as a fiducial mark by a laser at a position on a surface of the resin stencil.

According to a second aspect of the present invention, there is provided a method for forming a fiducial mark in a resin stencil according to the first aspect, and further including filling a resin of a different color from that of the resin stencil in the engraved recess thereby to form the fiducial mark.

According to a third aspect of the present invention, there is provided a method for forming a fiducial mark in a resin stencil according to the first aspect, and further including forming a metal plating of nickel, titanium or the like on the surface of the resin stencil.

According to a fourth aspect of the present invention, there is provided a method for forming a fiducial mark in a resin stencil according to the first or second aspect, and further including forming a metal plating of nickel, titanium or the like on the surface of the resin stencil except on the fiducial mark.

According to a fifth aspect of the present invention, there is provided a method for forming a fiducial mark in a resin stencil.

The method includes forming a metal plating of nickel, SUS, titanium or the like on a surface of the resin stencil except at a position on the surface, so that a non-metal plated part is rendered a fiducial mark.

According to a sixth aspect of the present invention, there is provided a stencil formed by a method for forming a fiducial mark in a resin stencil used in printing of a solder paste onto a wiring pattern of a circuit board.

The stencil is formed by a method which includes processing an engraved recess that does not penetrate the resin stencil to form a fiducial mark. The recess is formed by a laser at a position on a surface of the resin stencil.

According to a seventh aspect of the present invention, there is provided a stencil formed by a method for forming a fiducial mark in a resin stencil according to the sixth aspect. The stencil includes a resin-filled recess wherein the resin is a different color from that of the resin stencil in the non-penetrating engraved recess thereby forming the fiducial mark.

According to an eighth aspect of the present invention, there is provided a stencil formed by a method for forming a fiducial mark in a resin stencil according to the sixth aspect. The surface of the resin stencil is plated with a metal such as nickel, titanium or the like.

According to a ninth aspect of the present invention, there is provided a stencil formed by a method for forming a fiducial mark in a resin stencil according to the sixth or seventh aspect. The stencil also includes forming a metal plating of nickel, titanium or the like on the surface of the resin stencil except on the fiducial mark.

According to a tenth aspect of the present invention, there is provided a stencil formed by a method for forming a fiducial mark in a resin stencil.

The stencil includes forming a metal plating of nickel, SUS, titanium or the like on a surface of the resin stencil except at a position on the surface, so that a non-metal plated part is rendered a fiducial mark.

According to the aspects of the present invention, when the engraved recess which does not penetrate the resin stencil is formed by irradiation of laser lights from the laser when a printing opening pattern is processed in the resin stencil, a step required in the prior art to fill the through hole or to attach the aluminum adhesive tape from the rear side is eliminated. Therefore, processing efficiency is improved and a printing accuracy for the solder paste is also improved.

Further, according to the aspects of the present invention, when a resin of a different color from that of the resin stencil is filled in the engraved recess thereby to form the fiducial mark, the filling of the resin of a different color in the engraved recess is simpler and less expensive as compared with the prior art method which requires filling the resin in the through hole. Also, the fiducial mark can be recognized easily. Moreover, when a metal plating of nickel, titanium or the like is formed on the surface of the resin stencil, the resin stencil is improved in strength and abrasion resistance.

Further, according to the aspects, of the present invention, when the metal plating of nickel, SUS, titanium or the like is formed on the surface of the resin stencil except on the fiducial mark, and the nonmetal-plated engraved recess, which does not penetrate the resin stencil, is used as the fiducial mark, not only is the resin stencil improved in strength and abrasion resistance, but the fiducial mark can be recognized easily.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1A:
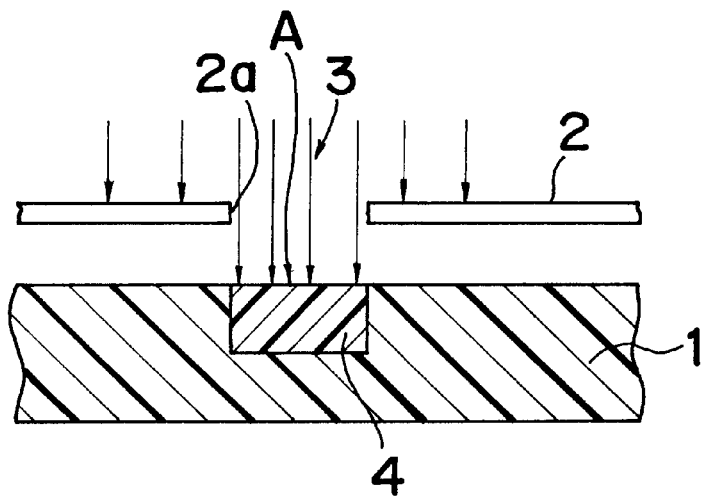
FIGS. 1A and 1B are diagrams showing a processing method according to an embodiment of the present invention.

Before the description of the present invention proceeds, it is to be noted that like parts are designated by like reference numerals throughout the accompanying drawings.

A method for forming a fiducial mark in a resin stencil according to a first embodiment of the present invention will be described with reference to FIGS. 1–5.

In FIG. 1A, a fiducial mark on a surface of a resin stencil 1 is determined at a position A where a resin stencil 1, when registered with a circuit board, agrees with a fiducial mark of the circuit board. In general, when the resin stencil 1 is used in the printing of solder paste onto a wiring pattern of the circuit board, the fiducial mark of the resin stencil 1 is used for positioning the resin stencil 1 on the circuit board.

Then, an opening 2a is formed at a part of a laser mask 2 corresponding to the position A. The laser mask 2 is used when an opening pattern is processed in the resin stencil 1 by irradiation of laser lights from an excimer laser 3.

When the opening pattern is processed in the resin stencil 1 by the excimer laser 3, the laser mask 2 is positioned over the resin stencil 1 and the opening 2a is positioned at the position A.

Figure 1B:
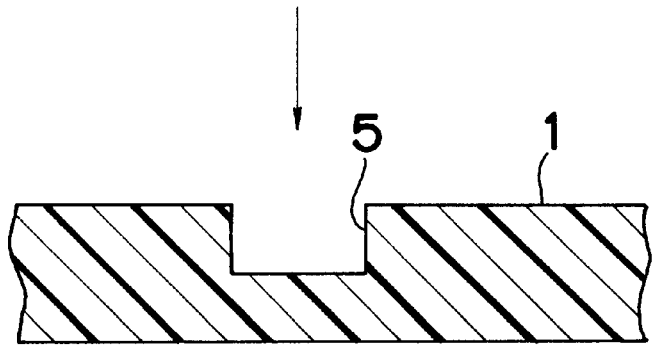

Subsequently, while the penetrating opening pattern is processed by the excimer laser 3, an engraved recess 4 is simultaneously formed through the opening 2a by the laser in a shorter time than the processing time of the opening pattern. As a result of this, an engraved recess 5, which does not penetrate the resin stencil, is obtained as a fiducial mark, as indicated in FIG. 1B. The excimer laser 3 is used because, in comparison with other lasers, a temperature rise in the periphery of the opening is small, a taper is hard to generate in the periphery of the opening pattern, and moreover the engraved recess 5 is easy to form.

Figure 2:
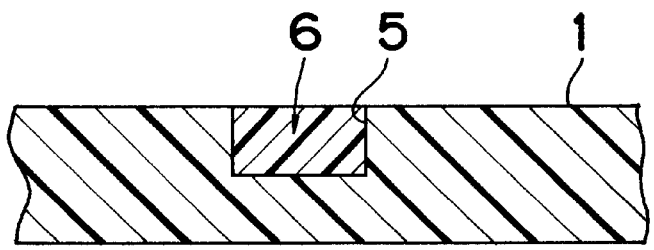
FIG. 2 is a diagram showing a processing method according to the embodiment of the present invention.

As shown in FIG. 2, a resin 6, of a different color from that of the resin stencil 1, is filled in the recess 5 of FIG. 1B, thereby forming the fiducial mark. This method of filling the resin in the through hole is simple and inexpensive in comparison with conventional methods. The fiducial mark can be recognized easily due to the color difference.

Figure 3:
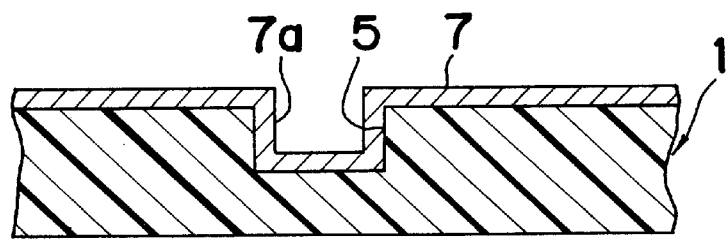
FIG. 3 is a diagram showing a processing method according to the embodiment of the present invention.

Thereafter, a metal plating 7 of nickel, titanium or the like is formed on the surface of the resin stencil 1, as in FIG. 3, resulting in a metal-plated engraved recess 7a which does penetrate the resin stencil. Accordingly, the resin stencil is improved both in strength and abrasion resistance.

Figure 4:
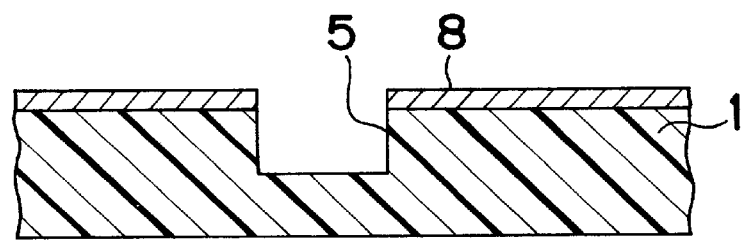
FIG. 4 is a diagram showing a processing method according to the embodiment of the present invention.

If a metal plating 8 of nickel, titanium or the like is formed, as shown in FIG. 4, on the surface of the resin stencil 1 except at the fiducial mark of FIG. 1B, the resin stencil 1 is further enhanced in strength and abrasion quality, and the fiducial mark becomes easy to recognize.

Figure 5:
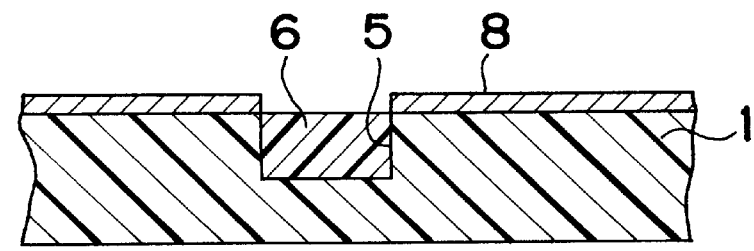
FIG. 5 is a diagram showing a processing method according to the embodiment of the present invention.

If the metal plating of nickel, titanium, or the like is formed on the surface of the resin stencil 1 as shown in FIG. 5 except that the fiducial mark of FIG. 2 filled with the resin 6, the strength and abrasion resistance of the resin stencil 1 are improved and the fiducial mark is easy to recognize.

A method for forming a fiducial mark in a resin stencil according to a second embodiment of the present invention will be described with reference to FIG. 6.

Figure 6:
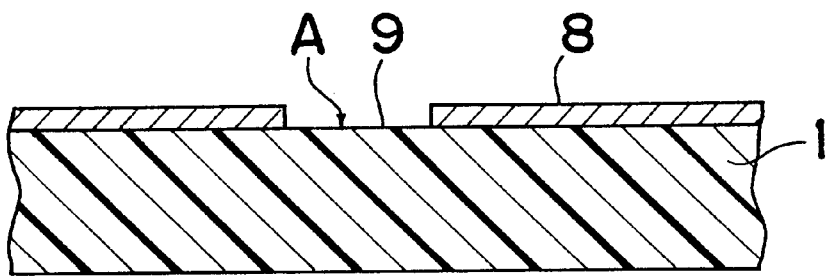
FIG. 6 is a diagram showing a processing method according to an embodiment of the present invention.
Figure 7:
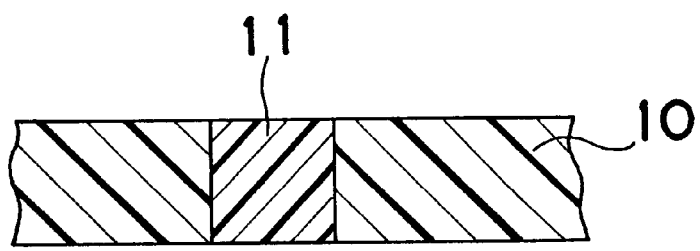
FIG. 7 is a diagram showing a conventional processing method.
Figure 8:
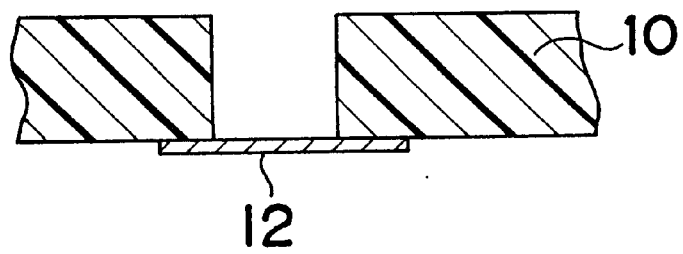
FIG. 8 is a diagram showing a conventional processing method.

Referring to FIG. 6, first, the position A where the resin stencil 1 when registered with the circuit board agrees with the fiducial mark of the circuit board is determined on the surface of the resin stencil 1.

Then, while the position A is masked, the surface of the resin stencil 1 is processed by vapor deposition or the like manner and the metal plating 8 of nickel, SUS, titanium or the like is formed. A portion or area 9 without the metal plating 8 works as the fiducial mark because of a color difference between the resin stencil 1 and metal plating 8. According to the method, the number of steps is reduced, the resin stencil is improved in strength and abrasive resistance, and the fiducial mark can be easily recognized.

According to the formation method, the engraved recess, which does not penetrate the resin stencil, is formed as the fiducial mark by the laser. Therefore, the process costs less in comparison with the prior art. Since it is not necessary to attach an aluminum adhesive tape from the rear side, the printing accuracy for the solder paste is advantageously improved.

When a resin of a different color from that of the resin stencil is filled in the engraved recess, this filling operation is simple and inexpensive in comparison with prior art methods where the resin is filled in the through hole. Moreover, the fiducial mark can be recognized easily.

When the metal plating of nickel, titanium or the like is formed on the surface of the resin stencil, both the strength and the abrasion resistance of the resin stencil are effectively improved.

According to the formation method, the metal plating of nickel, titanium or the like is formed on the surface of the resin stencil, and a part of the resin stencil without the metal plating is used as the fiducial mark due to the color difference between the resin and the metal plating. Therefore, the number of processing steps is reduced and the resin stencil is improved in strength and abrasion resistance, and at the same time, the fiducial mark can be recognized easily.

The entire disclosure of Japanese Patent Application No. 8-97082 filed on Apr. 18, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of forming a fiducial mark in a resin stencil used in printing of a solder paste onto a wiring pattern of a circuit board, the method comprising:

forming an engraved recess in a surface of a resin stencil to provide a fiducial mark on said resin stencil, wherein said engraved recess is formed by a laser and does not penetrate an opposite surface of said resin stencil;

filling said engraved recess with a resin having a color which is different than a color of the resin which forms said resin stencil, wherein said fiducial mark comprises said resin in said engraved recess; and forming a metal plating on the surface of said resin stencil.

2. The method as claimed in claim 1, wherein said metal plating comprises nickel or titanium.

3. A method of forming a fiducial mark in a resin stencil used in printing of a solder paste onto a wiring pattern of a circuit board, the method comprising:

forming an engraved recess in a surface of a resin stencil to provide a fiducial mark on said resin stencil, wherein said engraved recess is formed by a laser and does not penetrate an opposite surface of said resin stencil; and forming a metal plating on the surface of said resin stencil.

4. The method as claimed in claim 3, wherein said metal plating comprises nickel or titanium.

5. A method of forming a fiducial mark in a resin stencil, said method comprising:

forming a metal plating on a surface of a resin stencil except at a predetermined position on the surface of said resin stencil so as to form a non-metal plated area which serves as the fiducial mark.

6. The method as claimed in claim 5, wherein said metal plating formed on said surface of said resin stencil comprises nickel or titanium.

7. A resin stencil used in printing of solder paste onto a wiring pattern of a circuit board, said stencil comprising:

a resin plate;

a fiducial mark defined by an engraved recess formed in a first surface of said resin plate, wherein said engraved recess is formed by a laser and does not penetrate a second surface of said resin plate which is opposite relative to said first surface, and said engraved recess is filled with a resin material which is of a different color relative to a color of said resin plate; and a metal plating on said first surface of said resin plate.

8. The resin stencil as claimed in claim 7, wherein said metal plating comprises nickel or titanium.

9. The resin stencil as claimed in claim 6, further comprising a metal plating formed on said first surface of said resin plate, wherein said metal plating extends over said first surface except at said engraved recess.

10. A resin stencil used in printing of solder paste onto a wiring pattern of a circuit board, said stencil comprising:

a resin plate;

a metal plating of nickel and titanium formed on a first surface of said resin plate, wherein said metal plating is formed on said first surface of said resin plate except at a predetermined area so as to form a non-plated portion, wherein said non-plated portion defines a fiducial mark.

11. The method as claimed in claim 2, wherein said metal plating is formed on the surface of said resin stencil except at said fiducial mark.

12. The method as claimed in claim 4, wherein said metal plating is formed on the surface of said resin stencil except at said fiducial mark.

* * * * *